United States Patent
Tanaka et al.

[11] Patent Number: 6,091,667
[45] Date of Patent: Jul. 18, 2000

[54] SEMICONDUCTOR MEMORY DEVICE AND A DATA READING METHOD AND A DATA WRITING METHOD THEREFOR

[75] Inventors: Masahiro Tanaka, Moriyam; Hisatada Miyatake, Ohtsu; Yolaro Mori, Shiga-ken; Noritoshi Yamasaki, Sagamihara, all of Japan

[73] Assignee: International Business Machines Corporation, Armonk, N.Y.

[21] Appl. No.: 09/120,214

[22] Filed: Jul. 21, 1998

[30] Foreign Application Priority Data

Aug. 7, 1997 [JP] Japan .................................. 9-212758

[51] Int. Cl.$^7$ ...................................................... G11C 8/00
[52] U.S. Cl. .................................. 365/238.5; 365/230.01; 365/230.03; 365/230.08; 365/189.06; 365/230.02
[58] Field of Search ........................ 365/189.01, 230.01, 365/230.03, 230.08, 230.02, 189.06

[56] References Cited

U.S. PATENT DOCUMENTS

| | | | |
|---|---|---|---|
| 5,289,413 | 2/1994 | Tsuchida et al. ................... | 365/189.02 |
| 5,729,504 | 3/1998 | Cowles ..................................... | 365/226 |
| 5,737,258 | 4/1998 | Choi et al. ................................. | 365/63 |
| 5,875,140 | 2/1999 | Merritt et al. ........................... | 365/203 |
| 5,901,086 | 5/1999 | Wang et al. ........................ | 365/185.21 |

*Primary Examiner*—Viet Q. Nguyen
*Attorney, Agent, or Firm*—Robert A. Walsh

[57] ABSTRACT

A memory device to perform a plurality of data transfers during a single memory cycle without extending the cycle time for memory access, and to enhance the data transfer rate.

A memory array 1 has a plurality of word lines, a plurality of bit lines divided into a predetermined number of groups, and a plurality of memory cells. The bit lines are grouped based on a residue obtained by dividing a column address designating a bit line by the number of groups. The column address decoder 4 generates column addresses of the group number in accordance with the column address signal and an access order signal designating the access order for the groups. When the access order signal designates the ascending order, the bit line selection means 3 generates sequential column addresses, in a number equivalent to the group number and in the ascending order, with the column address signal serving as a reference. When the access order signal designates the descending order, the bit line selection means 3 generates sequential column addresses, in a number equivalent to the group number and in a descending order, with the column address signal serving as a reference.

7 Claims, 6 Drawing Sheets

SEMICONDUCTOR MEMORY DEVICE AND A DATA READING METHOD AND A DATA WRITING METHOD THEREFOR

FIELD OF THE INVENTION

The present invention relates to a semiconductor memory device, and in particular to a data reading method and a data writing method that enable a semiconductor memory device to perform a plurality of data transfers in a single memory cycle.

BACKGROUND

Increasing the data transfer rate is the most important objective when employing a semiconductor memory device, such as a DRAM (Dynamic Random Access Memory). For this purpose, a method for reducing the memory cycle time or a method for increasing the data width is conventionally employed.

A page mode method is one that can be used for reducing the memory cycle time, but more or less at the cost of efficient random access. The page mode is one whereby a plurality of bit lines are successively selected while a single word line is designated by the provision of a specific row address. Since access in the direction of the row, which takes time, is made unnecessary by fixing the word line at an active state, the cycle time can be reduced. In page mode, however, a series of processes required for a memory cycle, i.e., the fetching of a column address, decoding, bit line selection and the driving of a data circuit, must be performed for each data access, and accordingly, any reduction in the cycle time is limited. Furthermore, when a data transfer rate is to be increased by reducing the length of a memory cycle, the power consumption is increased in proportion to the number of cycles in a unit of time.

A method of pipelining a memory operation is a method for effectively shortening the length of a cycle time without reducing the length of a memory cycle. However, when the memory operation is pipelined, shortcomings arise in that a fast clock is required to provide synchronization for pipe lines; in that the consumed power increases because more control circuits are operating at the same time; and in that control becomes complicated. There are some recent SRAMs, overall operation of which are pipelined, that serve as secondary caches. Although the pipelining of DRAM is not as easy as it is for SRAM, a synchronous DRAM is an example where CAS circuits, including a data system, are pipelined. In these pipelined memories, the memory cycles are complete cycles that include a series of operations, such as the input or generation of an address, the decoding of an address, the selection of a storage location as a result and the driving of a data system circuit. The pipeline processing is to virtually reduce the cycle time by dividing the operation in a memory cycle into a plurality of stages and b simultaneously executing a plurality of cycles at different operating stages.

Another method is one whereby data are pre-fetched for a plurality of addresses (e.g., four addresses), like a DRAM having a nibble mode. In this case, the memory must have the same number of data latches as there are addresses for which data are pre-fetched. In this type of memory, an address may internally, automatically be generated for the memory cycles at the second and subsequent contiguous accesses. An address to be automatically generated is limited to an address range that is determined by a predetermined address bit count (e.g., the two or three lowest bits of an address). Therefore, an address that exceeds the range, i.e., an address for which the settings of higher bits must be changed, cannot be accessed. As a result, arbitrary sequential addresses cannot be accessed by the internal automatic generation of addresses.

In addition, there is another method in which the width of data is increased. However, since many terminals must be provided, the chip area is expanded due to an increase in the number of terminals and of data system circuits, and as the terminals that simultaneously switch their states are also increased, noise adversely affects the circuit operation.

SUMMARY OF THE INVENTION

For all of the above described methods it is assumed that only one data transfer is performed in a single memory cycle. Under these circumstances, it becomes prominent that the increase in data transfer rate and the address range are limited. The enhancement of the data transfer rate is particularly desired in the graphics display field, and since in the graphics display field data transfers that exceed word boundaries or double word boundaries are frequently performed, an address range that is limited to the lowest bits of address cannot handle such a data transfer.

It is, therefore, one object of the present invention to improve a data transfer rate for a memory.

It is another object of the present invention to perform a plurality of data transfers during a single memory cycle without extending the cycle time.

It is an additional object of the present invention to perform a plurality of data transfers during a single memory cycle for a plurality of continuous addresses that exceed word boundaries or double word boundaries, without extending the cycle time.

To achieve the above objects, according to the first aspect of the present invention, a semiconductor memory device comprises: a memory array having a plurality of word lines, a plurality of bit lines divided into a predetermined number of groups, and a plurality of memory cells, each of which is located at an intersection of the word line and the bit line, the bit lines being grouped based on a residue obtained by dividing a column address designating the bit line by the number of groups; word line selection means for selecting one of the word lines in accordance with a row address signal; bit line selection means for selecting one of the bit lines for each of the groups in accordance with a column address signal and an access order signal designating the access order for the groups; and a plurality of latch means, each of which is provided for each of the groups for latching data, wherein, when the access order signal designates the ascending order, the bit line selection means generates a plurality of column addresses corresponding to the group number, the column addresses contiguous in the ascending order with the column address signal serving as a reference, wherein, when the access order signal designates the descending order, the bit line selection means generates column addresses corresponding to the group number, the column addresses contiguous in the descending order with the column address signal serving as a reference, and wherein the bit line selection means respectively connects a plurality of bit lines designated by the generated column addresses, to the latch means corresponding to the groups to which the bit lines belong.

The bit line selection means may include a column address decoder and a bit switch circuit. Furthermore, bit line precharge means connected to the bit lines and sense amplifier means connected to the bit lines may be provided. The first aspect of the present invention is particularly effective for a DRAM.

In addition, multiplexer means connected to the plurality of latch means may be provided for selectively connecting the latch means to input/output terminals. The multiplexer means sequentially connects the latch means to the input/output terminals in the order that is determined in accordance with the column address signal at least. When the group number is equal to or greater than three, the multiplexer means may connect sequentially the latch means to the input/output terminals in the order determined in accordance with the column address signal and the access order signal.

Each of the latch means includes a read latch circuit for latching data on a bit line, and a write latch circuit for latching data supplied to the input/output or input terminals.

According to the second aspect of the present invention, a data reading method is provided for a semiconductor memory device including a memory array having a plurality of word lines, a plurality of bit lines divided into a predetermined number of groups, and a plurality of memory cells, each of which is located at an intersection of the word line and the bit line, the bit lines being grouped based on a residue obtained by dividing a column address designating the bit line by the number of groups, wherein a plurality of data stored in the memory cells belonging to the groups are read in accordance with a row address signal, a column address signal and an access order signal, the access order signal indicating the access order for the groups, the data reading method comprising the steps of: selecting the word line in accordance with the row address signal; generating, when the access order signal designates an ascending order, a plurality of column addresses corresponding to the group number, the column addresses continuous in an ascending order with the column address signal serving as a reference, and generating, when the access order signal designates a descending order, a plurality of column addresses corresponding to the group number, the column addresses continuous in the descending order with the column address signal serving as a reference, latching data on the plurality of bit lines designated by the generated column addresses; and outputting the latched data in the order determined by the column address signal at least.

It is preferable that all the steps of the second aspect be performed during a single memory cycle.

The output order at the step for outputting data may be determined in accordance with the column address signal and the access order signal.

According to a third aspect of the present invention, a data writing method is provided for a semiconductor memory device including a memory array having a plurality of word lines, a plurality of bit lines divided into a predetermined number of groups, and a plurality of memory cells, each of which is located at an intersection of the word line and the bit line, the bit lines being grouped based on a residue obtained by dividing a column address designating the bit line by the number of groups, wherein a plurality of data are stored in the memory cells belonging to the groups in accordance with a row address signal, a column address signal and an access order signal, the access order signal designating the access order for the groups, the data writing method comprising the steps of: latching a plurality of externally supplied data in the order determined in accordance with the column address signal at least; generating, when the access order signal designates an ascending order, a plurality of column addresses corresponding to the group number, the column addresses contiguous in an ascending order with the column address signal serving as a reference, and generating, when the access order signal designates a descending order, a plurality of column addresses corresponding to the group number, the column addresses contiguous in a descending order with the column address signal serving as a reference; transferring the latched data to each of the plurality of bit lines designated by the generated column addresses; and storing data in each of the plurality of memory cells designated by the row address signal and the plural column addresses.

It is preferable that all the steps of the third aspect be performed during a single memory cycle.

The latching order at the step for latching data may be determined in accordance with the column address signal and the access order signal.

BRIEF DESCRIPTION OF THE DRAWINGS

Embodiments of this invention are described below with reference to the following drawings.

Figure 8:
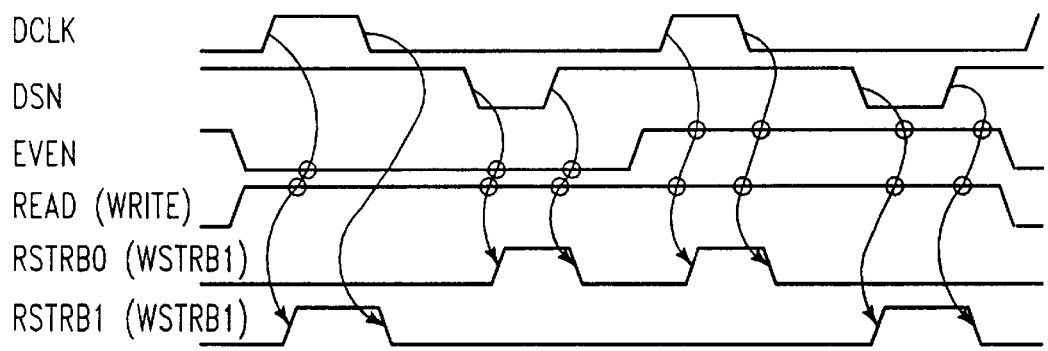
Figure 5:
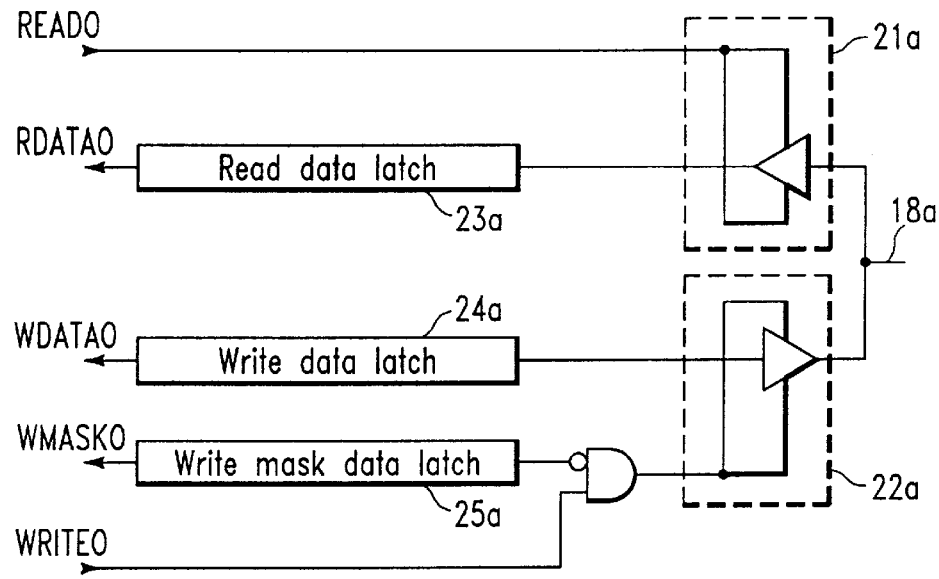
Figure 6:
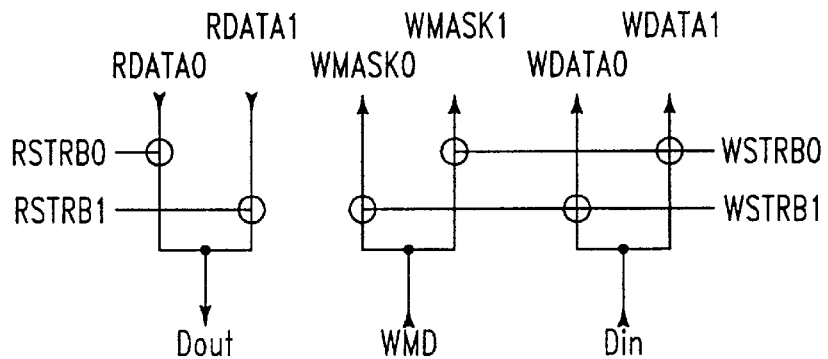
Figure 7:
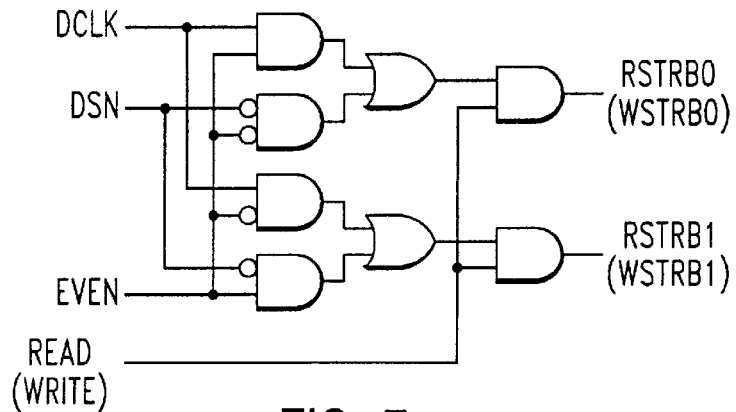

Embodiments of this invention are described below with reference to the following drawings:

FIG. 5 is a circuit diagram illustrating a data latch for an even number group;

FIG. 6 is a schematic diagram illustrating a data multiplexer;

FIG. 7 is a circuit diagram illustrating a data strobe circuit;

FIG. 8 is a timing chart for the data strobe circuit; and

Figure 9:
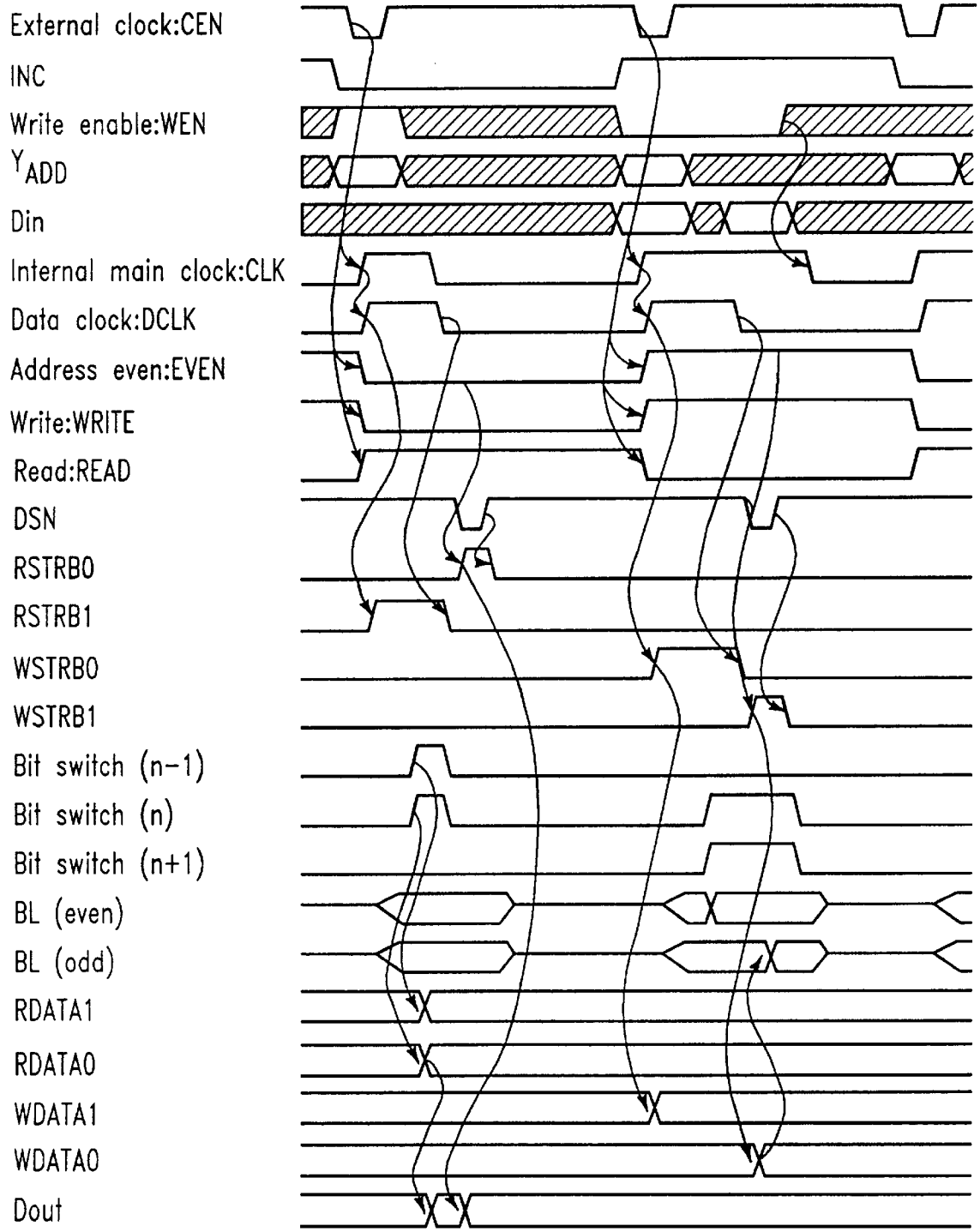

FIG. 9 is a timing chart for a DRAM according to the second embodiment of the present invention.

DESCRIPTION OF THE PREFERRED EMBODIMENT

Figure 1:
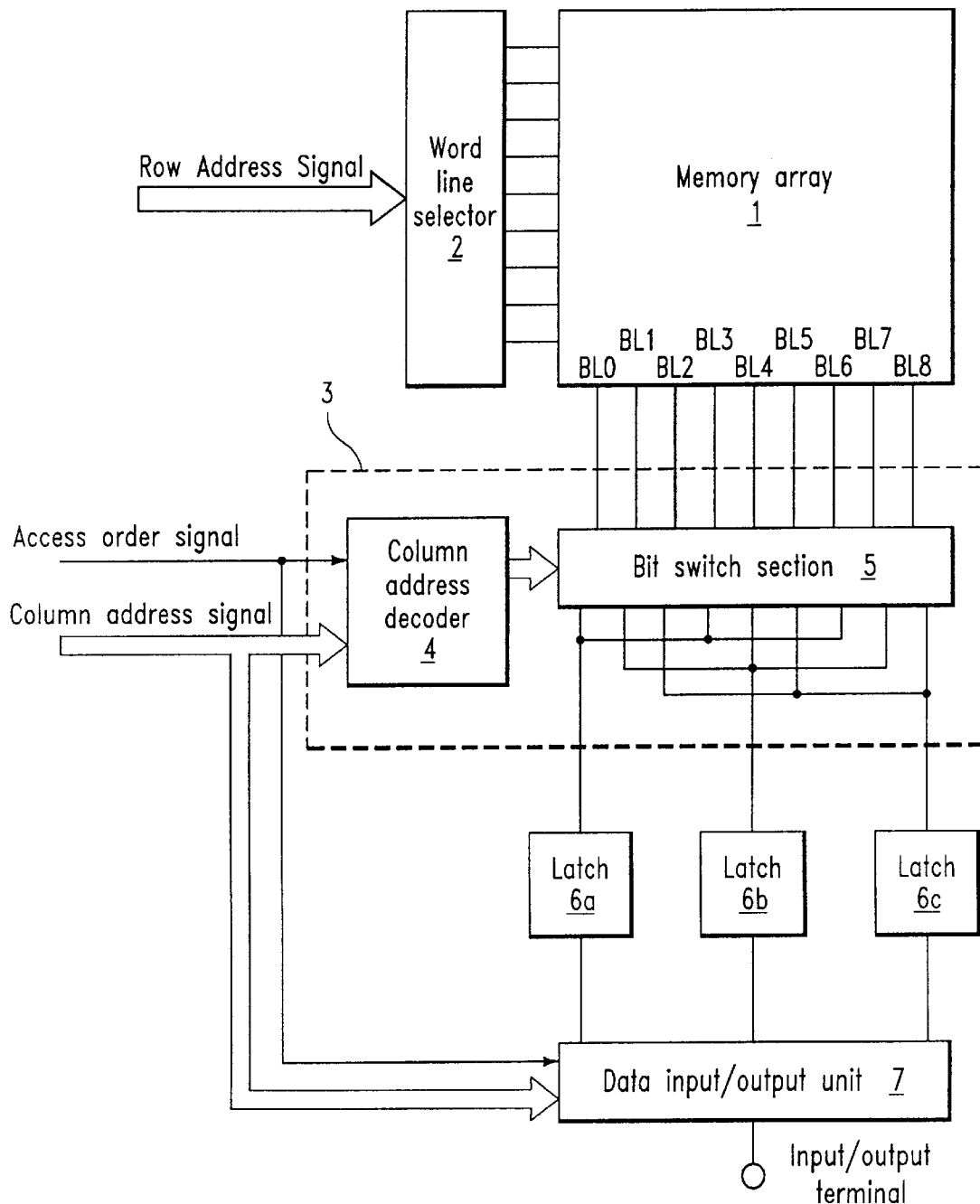
FIG. 1 is a circuit block diagram illustrating a semiconductor memory device according to a first embodiment of the present invention.

FIG. 1 is a circuit block diagram illustrating a semiconductor memory device according to a first embodiment of the present invention. A memory array 1 includes word lines designated by row addresses, bit lines designated by column addresses, and multiple memory cells, each of which is located at an intersection of a word line and a bit line. The bit lines are divided into a predetermined number of groups. In FIG. 1, bit lines are divided into three groups.

The bit lines are sorted into three groups based on residues (0,1 and 2) obtained by dividing corresponding column addresses by the number of groups, i.e., three. When a column address is 9, the leftmost bit line BL0 in FIG. 1 is selected. As the column address is incremented by one, an adjacent bit line to the right is sequentially selected. In this case, according to the residue of three, the bit lines are sorted as follows:

Residue 0: {BL0, BL3, BL6, . . . } (first group)
Residue 1: {BL1, BL4, BL7, . . . } (second group)
Residue 2: {BL2, BL5, BL8, . . . } (third group)

It should be noted that arbitrary continuous bit lines (e.g., BL2, BL3 and BL4) always belong to different groups.

A word line selector 2 selects one word line that is designated by an eternally received row address signal. A bit line selector 3 selects a plurality of bit lines, and includes a column address decoder 4 and a bit switch section 5. The bit line selector 3 is characterized by selecting three bit lines at the same time in accordance with externally generated column address and access order signals that are received.

First, a column address signal and an access order signal are transmitted to the column address decoder 4. The column address signal consists of a plurality of bits for designating a specific bit line, and the access order signal consists of one bit designating the access order for the groups (e.g., a value 0 of this signal designates the descending order and "1" designates the ascending order).

In accordance with these signals, the column address decoder 4 generates three, which corresponds to the group number, contiguous column addresses. Assume that a specific bit line $BL_i$ is selected by a column address signal. When the access order signal designates the descending order (a bit 0), with the bit line $BL_i$ serving as a reference, the column address decoder 4 generates three column addresses for selecting three bit lines ($BL_i$, $BL_{i-1}$, $BL_{i-2}$), contiguous in the descending order. When the access order signal designates the ascending order (a bit 1), with the bit line $BL_i$ serving as a reference, the column address decoder 4 generates three column addresses for selecting three bit lines ($BL_i$, $BL_{i+1}$, $BL_{i+2}$), which are continuous in the ascending order. When the bit line $BL_i$ belongs to the first group, the three bit lines belong to groups shown as follows.

| Designated by column address signal | Access order signal | 3 BLs | Group |
|---|---|---|---|
| $BL_i$ | descending order (bit 0) | $BL_i$<br>$BL_{i-1}$<br>$BL_{i-2}$ | 1<br>3<br>2 ↓ |

-continued

| Designated by column address signal | Access order signal | 3 BLs | Group |
|---|---|---|---|
| $BL_i$ | ascending order (bit 1) | $BL_i$<br>$BL_{i+1}$<br>$BL_{i+2}$ | 1<br>2<br>3 ↓ |

As is described above, the access order signal is generated when a user designates increment or decrement of a column address signal by one to generate three continuous column addresses from a single column address signal. As was previously described, since these bit lines are sorted into groups that differ from each other, the access order signal designates the access order for the groups (ascending order or descending order).

The bit switch section 5 simultaneously selects three bit lines designated by the three column addresses generated by the column address decoder 4. Since the three bit lines belong to different groups, one bit line is selected for each group.

A first latch 6a is provided for the first group, a second latch 6b for the second group, and a third latch 6c for the third group. The latches 6a, 6b and 6c provided for the corresponding groups are circuits for latching data. the bit switch section 5 connects one bit line of each group to a corresponding latch. When data are to be read,. a pertinent latch latches data on one bit line selected from each group. When data are to be written, data latched in the latch in advance are transferred to one bit line selected from each group.

A data input/output section 7 sequentially connects the input/output terminal to latches 6a, 6b and 6c at predetermined timings in the group access order, which is determined in accordance with the column address signal and the access order signal. By referring to Table 1, when the access order signal designates the descending order, the groups (1→3→2) are accessed, and the first latch 6a, the third latch 6c and the second latch 6b are connected in order to the input/output terminal. When the access order signal designates the ascending order, the groups (1→2→3) are accessed, and the first latch 6a, the second latch 6b and the third latch 6c are connected in order to the input/output terminal.

Data reading in the first embodiment is performed as follows. First, one word line and three bit lines are simultaneously selected in accordance with externally originating row address, column address and access order signals that are received. Then, data stored in three memory cells are latched simultaneously by corresponding latches 6a, 6b and 6c via the bit switch section 5. Following this, the data input/output section 7 sequentially outputs the latched data to the input/output terminal in the order (order indicated by the arrow on the right in Table 1) that is determined based on the column address signal and the access order signal.

To determine the order in which to output data, at least a column address signal must be referred to. When the group number is two or more, although the order for a starting group is determined by the column address signal, the order for the remaining groups can not be determined without referring to the access order signal. This applies to data writing.

The data writing in the first embodiment is performed by using in inverted order the procedures employed for the data reading. First, the data input/output section 7 sequentially receives three data at the input/output terminal, and transmits them to the latches 6a, 6b and 6c in the order determined in accordance with the contents of the column address signal and the access order signal. Then, the latched data are transferred to three bit lines designated by the column address signal and the access order signal. As the result, the data are stored in memory cells at intersections of a word line, which is designated by a row address signal, and the three bit lines.

With the thus arranged semiconductor memory device, three data, which are stored in accordance with the row address signal, the column address signal and the access order signal, are latched during a single memory cycle and are output in a predetermined order in the same cycle, so that the three sets of data can be read in one memory cycle. Similarly, three data bit sets can be sequentially latched, and stored in three memory cells during a single memory cycle by transmitting the row address signal, the column address signal and the access order signal in that memory cycle. As a result, the data transfer rate can be increased.

A memory cycle, a term that is well known to one having ordinary skill in the art, is a series of operations, beginning with the input of an address or the automatic internal generation of an address and includes accessing (for reading or writing, or both) of data at the address, that continues until a standby state is entered to await the receipt of the next address. For a DRAM, the memory cycle includes not only a normal operation cycle performed by designating a row address, but also individual operation cycles in a page mode and an operation cycle in a read-modify-write process.

Figure 2:
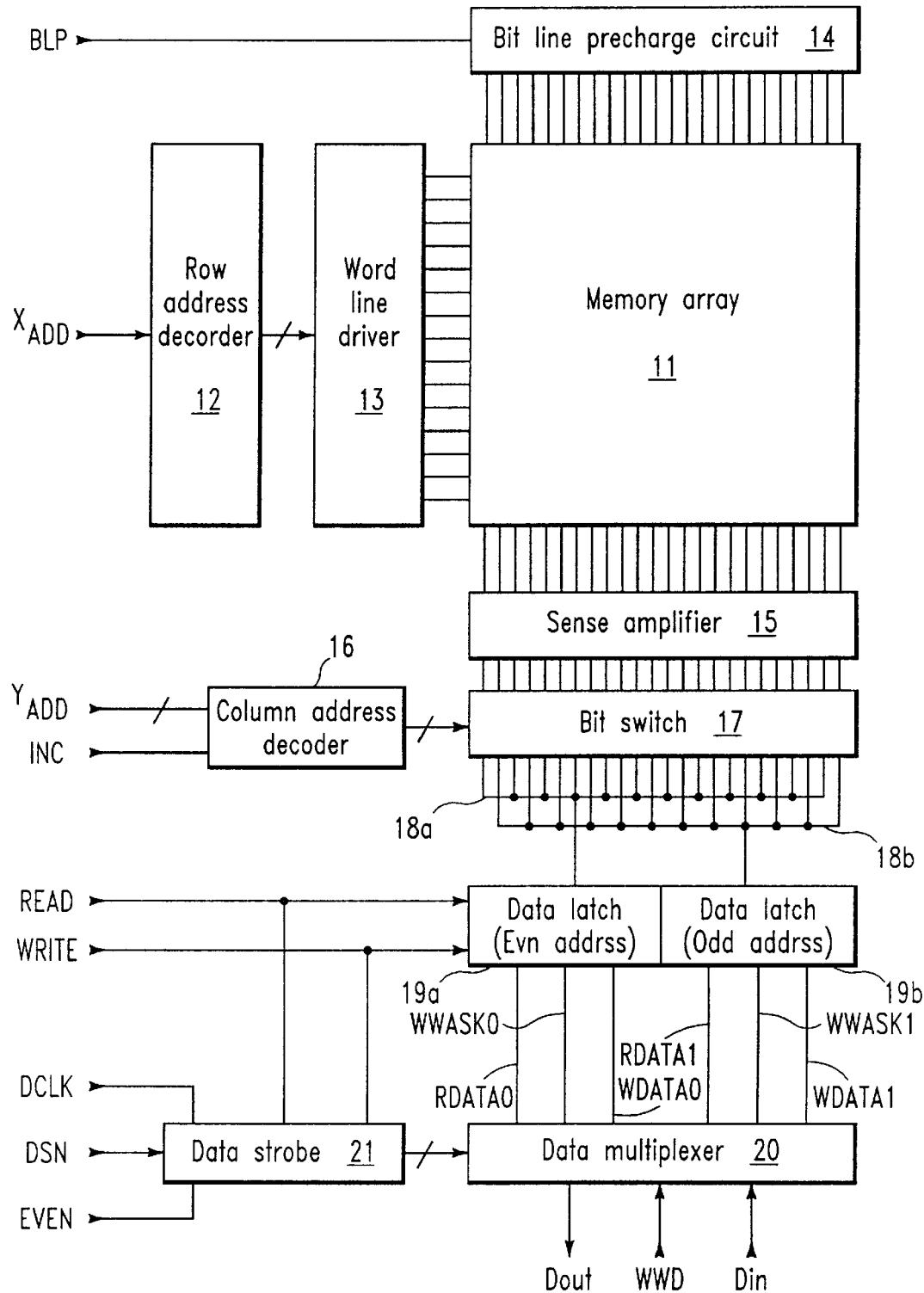
FIG. 2 is a circuit block diagram illustrating a DRAM according to a second embodiment of the present invention.

FIG. 2 is a circuit block diagram illustrating a DRAM according to a second embodiment of the present invention.

In the DRAM, data at arbitrary contiguous column addresses, which may cross a word boundary, can be accessed (for reading or writing) twice during a single memory cycle. The circuit arrangement for the DRAM will now be explained while referring to the data reading. A word boundary here is the boundary of an address range that is determined by the upper bits of a column address.

Multiple memory cells arranged as a matrix shape are located in a memory array 11, and are connected to word lines in the row direction and to bit lines in the columnar direction. One memory cell includes a transistor and a capacitor. A row address decoder 12 selects a single word line designated by an input row address signal $X_{ADD}$. A word line driver 13 sets to a predetermined potential only a word line selected by the row address decoder 12.

A bit line precharge circuit 14 and a sense amplifier 15 are connected to the bit lines. The bit line precharge circuit 14 precharges the bit lines to a predetermined potential at a timing consonant with a received bit line precharge signal BLP. The sense amplifier 15 amplifies the potential on each bit line.

In this embodiment, the bit lines are divided into two groups. Specifically, corresponding column addresses are sorted into an even number group and an odd number group in accordance with residues (residues 0 and 1) obtained by dividing the column addresses by two. Two data system circuits for even number column addresses and odd number column addresses are provided.

Figure 3:
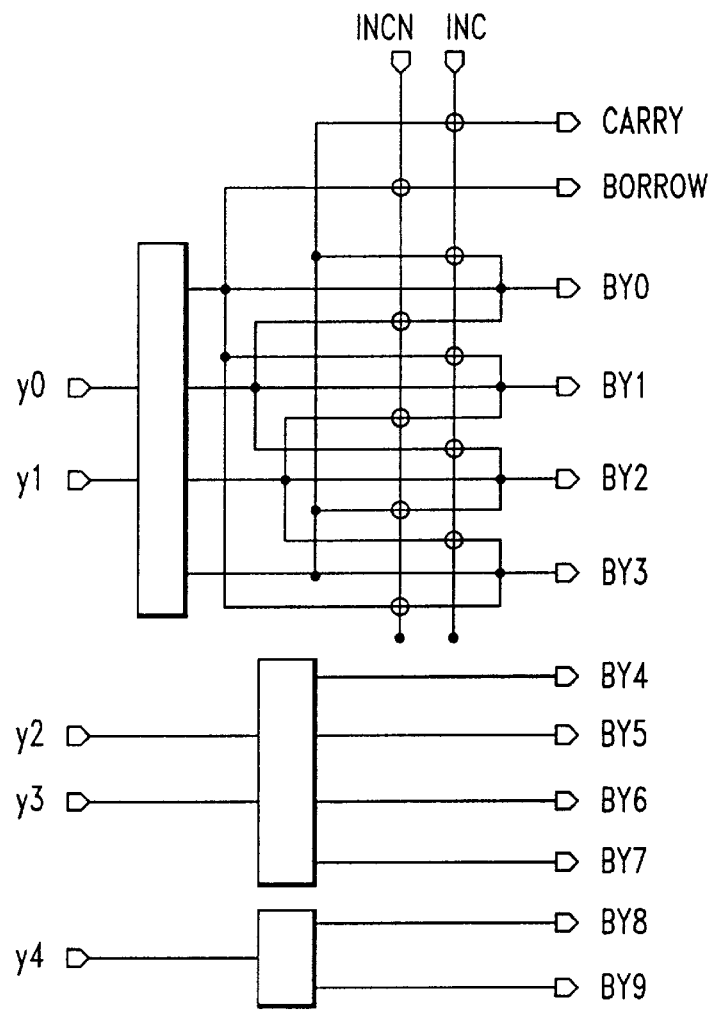
FIG. 3 is a schematic circuit diagram illustrating the front stage of a column address decoder.
Figure 4:
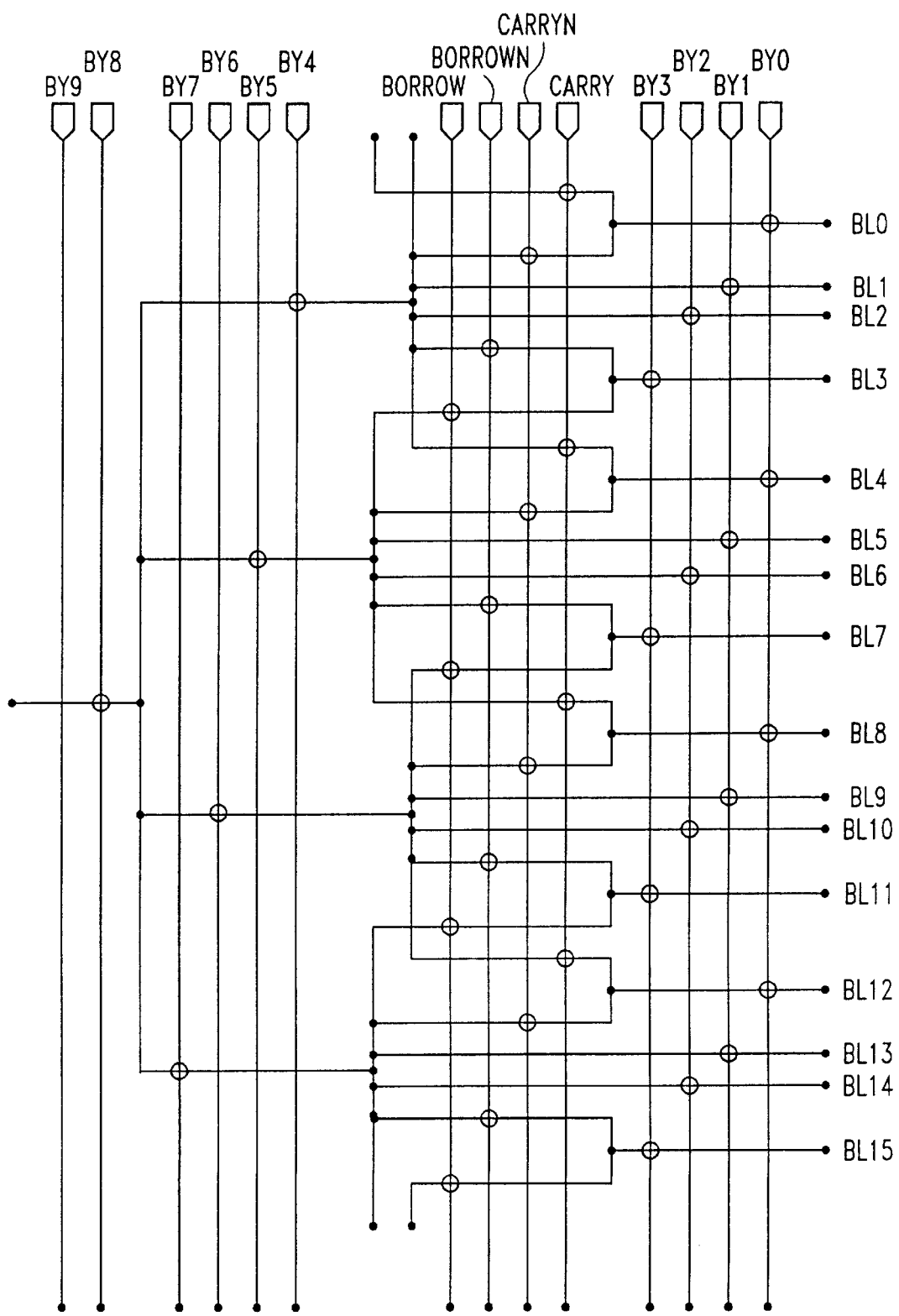
FIG. 4 is a schematic circuit diagram illustrating the final stage of the column address decoder.

A column address decoder 16 generates two sequential column addresses based on a column address signal $Y_{ADD}$ which designates a specific bit line, and a one-bit access order signal INC. FIGS. 3 and 4 are schematic circuit diagrams illustrating the front end stage and the back end stage of the column address decoder 16.

The five bit (y0 to y4) column address signal $Y_{ADD}$ and the access order signal INC (INCN is an inverted INC signal) are input at the front stage of the column address decoder 16 in FIG. 3. When value 1 of an access order signal INC input by a user is set, it means accessing will be performed in the ascending order, i.e., a column address signal will be incremented by one. When value 0 of an access order signal INC is set, it means that accessing will be performed in the descending order. Subsequently, a signal CARRY output by the decoder at the front stage selects a bit line from an upper block that is adjacent to a block defined by an input address, and an output signal BORROW selects a bit line from a lower block that is adjacent to a block defined by an input address.

The back end or latter stage of the column address decoder 16 in FIG. 4 is connected to the output terminals of the front stage. The column address decoder 16 can generate two arbitrary continuous column addresses that cross word boundaries. By referring to FIGS. 3 and 4, it will be easy for one having ordinary skill in the art to understand the operation of the column address decoder 16; however, if necessary, one can also refer to Japanese Patent Application No. Hei 8-18930 (Our docket No.: JA995087) for a detailed description of the operation of the column address decoder 16. A signal CARRYN is the inverted signal for the signal CARRY, and a signal BORROWN is the inverted signal for the signal BORROW.

Multiple bit lines are connected to a bit switch circuit block 17 via the sense amplifier 15. In accordance with two column addresses generated by the column address decoder 16, one bit line is simultaneously selected from each of the even number group and the odd number group at the same time. Data on the selected bit line of the even number group is latched by a data latch 19a for an even number group via an even number local data line 18a. Similarly, the data on the selected bit line of the odd number group is latched by a data latch 19b for an odd number group via an odd number local data line 18b.

FIG. 5 is a circuit diagram illustrating the data latch 19a for the even number group. The data latch 19b for the odd number group has the same configuration (symbols a in FIG. 5 should be changed to b). The even number local data line 18a is connected to a read data amplifier 21a and a write driver 22a. For reading data, data on the even number local data line 18a are transferred from the read data amplifier 21a to a read data latch 23a and are latched therein. The read data latch 23a outputs the latched data as read data RDATA0 at a predetermined timing. Through the same operation, read data RDATA1 is output by the data latch 19b for the odd number group. The read data RDATA0 and RDATA1 output by the latches 19a and 19b are transferred to a data multiplexer 20.

For writing data, write data WDATA0 and write mask data WMASK0 supplied by the data multiplexer 20 are latched by a write data latch 24a and a write mask data latch 25a. The data are transferred as write data to an even number local data line 18a at a predetermined timing by a write driver 22a. In the same manner, based on the write data WDATA1 and the write mask data WMASK1, write data are transferred to an odd number local data line 18b from the data latch 19b for the odd number group.

A data strobe circuit 21 generates signals for controlling the data latches 19a and 19b and the data multiplexer 20. To control the individual circuits, a read signal READ, a write signal WRITE, a data clock DCLK, a strobe signal DSN and a group select signal EVEN, which indicates whether a column address has an even number or an odd number, are employed. A data input line $D_{in}$, a write mask data line WMD and a data output line $D_{out}$ are connected to the data multiplexer 20.

FIG. 6 is a circuit diagram illustrating the data multiplexer 20.

FIG. 7 is a circuit diagram illustrating a data strobe circuit 21. In accordance with the read signal READ and the write signal WRITE, the group select signal EVEN and the data clock DCLK, the first data strobe signal (either a read data strobe signal <RSTRB0 or RSTRB1> for reading, or a write data strobe signal <WSTRB0 or WSTRB1> for writing) is generated. Then, the strobe signal DSN is employed to generate a second data strobe signal (either a read data strobe signal <RSTRB1 or RSTRB0> for reading, or a write data strobe signal <WSTRB1 or WSTRB0> for writing). When, for example, data are to be written in the even number group and the odd number group order, first, the even write data strobe signal WSTRB0 is generated, and following the second data strobe signal, the odd write data strobe signal WSTRB1 is generated.

In accordance with a data strobe signal, the data multiplexer 20 outputs the first data (e.g., when the even number read data is RDATA0) to the data output line $D_{out}$. Then, when the strobe signal DSN is received and the second data reading is requested, the data strobe circuit 21 outputs the second data strobe signal. In response to this, the data multiplexer 20 outputs the second read data (odd number read data RDATA1 in this case) as the second output data to the data output line $D_{out}$. Since at the time of data output the two read data sets RDATA0 and RDATA1 are already latched by the read data latches 23a and 23b, the bit switch circuit 17 can be turned off using the same timing as issued for a normal DRAM that performs only one data transfer. Therefore, the cycle time will not be extended for the two data readings.

FIG. 8 is a timing chart for the data strobe circuit 21 when a start address is an odd number. In this example, although the first data transfer is synchronized with the data clock DCLK, the strobe signal DSN can be employed for the first data transfer.

The data clock DCLK is generated based on an externally received chip enable signal CEN (not shown). The strobe signal DSN is produced by using an external signal designating a data transfer. The group select signal EVEN, designating an even number or an odd number as a start address, is generated based on the least significant bit of the column address signal $Y_{ADD}$, which is externally fetched at the start of the memory cycle. When the group number is two, the access order is automatically determined, so long as the group select signal EVEN is employed to determine whether the group at the start address has an even number or an odd number, and the access order signal INC is not referred to by the group select signal EVEN.

For writing, before a memory cycle begins, for example, write mask data 1 has been latched in advance by the write mask data latches 25a and 25b in the preceding memory cycle. When a write mask signal reflects a bit value 1 or a write signal reflects a bit value 0, the write driver is not activated. When the memory cycle begins, in the same manner as for reading, the bit switch circuit 17 is turned on at the same time for an even number and an odd number in accordance with the input column address signal $Y_{ADD}$ and the access order signal INC.

At this time, via the data multiplexer 20, the first write data (e.g., the even number write data WDATA0) and the write mask data (WMASK0 in this case) are latched by the write data latches 24a or 24b and the write mask data latches 25a or 25b. The second write data (WDATA1) and the write mask data (WMASK1) are not latched until the strobe signal DSN is input. Since bit value 1 is set in advance in the write mask data latches 25a and 25b, the write driver for the second writing is not activated. Therefore, writing is not mistakenly performed.

As for a memory having a bit write function and a byte write function, the write mask signal for each data bit or for each data byte is related to the write mask data WMASK0 and WMASK1 for an even number and an odd number. As for a memory having neither function, the write mask data serve as a pair of control signals for all data bits.

The operation of the bit switch circuit 17 for writing sometimes differs from that for reading. This is because the bit switch circuit 17 must be on until the second writing is completed. When a request for the second writing, i.e., the input of the strobe signal DSN, is performed earlier than the timing when the bit switch circuit 17 is turned off in the read operation, the bit switch circuit 17 can be turned off at the same timing as that for a normal memory that performs one data transfer. Therefore, the cycle time is not extended for two data writings. When the receipt of the second writing request is after a specific period of time since the cycle began, the time period for the bit switch circuit 17 being on is extended and accordingly, the cycle time is extended.

The resetting (restoring or precharging in case of the DRAM) of almost all the individual circuits in the memory must be delayed until the bit switch is turned off, and the turning off the bit switch circuit must be delayed until the second writing request is issued. Therefore, means is required for notifying a memory device as to whether or not the second writing request has been issued. However, in a normal DRAM, since the leading edge of the negative-active RAS signal serves as a restoring/precharging start signal, this signal can be employed as this notification means, and there is no particular need for a new signal. However, a signal must be transmitted to a memory having a self-precharge function, designating how long the start of a precharge should be delayed; but this can be easily handled without increasing the number of signal lines.

FIG. 9 is a timing chart for a DRAM in the second embodiment. As is shown in FIG. 9, two sets of data can be accessed during a single memory cycle.

In this embodiment, two data systems are provided for the even number group and the odd number group, and the column address decoder 16 is designed so that it can adequately control these data systems. As a result, a flexible arrangement that can access contiguous addresses crossing word boundaries can be provided without necessitating a drastic increase in the number of circuits. In a conventional DRAM having a nibble mode, the addresses crossing the word boundaries can not be accessed, while in the above described arrangement, contiguous addresses can be flexibly accessed regardless of whether the start address is an even number or an odd number.

In a single clock DRAM having a self-precharge function, in addition to a basic clock signal (e.g., a chip enable signal CEN) for activating a memory cycle, a signal DSN for exchanging data with the outside, i.e., a signal for controlling a data transfer, is received. With these signals, two data exchanges to/from arbitrary contiguous addresses (arbitrary contiguous addresses crossing the word boundaries), can be performed during a single memory cycle without the cycle time being adversely affected.

When access for two or more contiguous addresses is required, a fast sequential access can be performed by employing the pipeline operation. Additional circuits are a portion where double data systems and their controllers are provided, a portion where a column address decoder is changed, and a controller for a data strobe. Since the column address decoder consumes almost the same power as is consumed during the conventional single address selection process, and since there is a minimal number of the additional circuits, the increase in the power consumption is smaller than that required for a pipeline operation performed by a synchronous DRAM or that required for a DRAM in the static column mode. That is, since a data transfer covering two cycles can be performed during a single cycle, the same effect can be obtained while consuming a smaller amount of power, compared with a fast transfer memory that performs a pipeline operation during which different operational stages of different memory cycles are performed at the same time.

In the second embodiment, as is explained for the single clock DRAM, the above described method can be applied for a DRAM that is controlled by using a conventional negative-active RAS signal and a conventional negative-active CAS signal. In this case, to exchange data twice during a single CAS cycle, only an external signal designating a data transfer need to be added. The method of the present invention can also be applied for a SRAM or a ROM.

As is described above, according to the present invention, in the thus arranged memory device, a plurality of data transfers can be performed during a single memory cycle without extending the cycle time. As a result, the data transfer rate can be enhanced. Furthermore, without extending the cycle time, during a single memory cycle a plurality of data transfers can be performed for a plurality of contiguous addresses crossing the word boundaries or the double word boundaries.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

What is claimed is:

1. A semiconductor memory device comprising:

a memory array having a plurality of word lines a plurality of bit lines, divided into a predetermined number of groups, and a plurality of memory cells, each of which is located at an intersection of said word line and said bit line, said bit lines being grouped based on a residue obtained by dividing a column address designating said bit line by said number of groups;

word line selection means for selecting one of said word lines in accordance with a row address signal;

bit line selection means for selecting one of said bit lines for each of said groups in accordance with a column address signal and an access order signal designating the access order for said groups;

a plurality of latch means, each of which is provided for each of said groups for latching data; and multiplexer means, connected to said plurality of latch means, for selectively connecting said latch means to input/output terminals wherein, when said access order signal designates the ascending order, said bit line selection means generates a plurality of column addresses corresponding to the group number, said column addresses contiguous in said ascending order with said column address signal serving as a reference, wherein, when said access order signal designates the descending order, said bit line selection means generates column addresses corresponding to the group number, said column addresses contiguous in said descending order with said column address signal serving as a reference, and wherein said bit line selection means respectively connects said bit lines designated by said generated column addresses, to said latch means corresponding to said groups to which said bit lines belong.

2. The semiconductor memory device according to claim 1, wherein said bit line selection means includes a column address decoder and a bit switch circuit.

3. The semiconductor memory device according to claim 1, further comprising bit line precharge means, connected to said bit lines, and sense amplifier means, connected to said bit lines.

4. The semiconductor memory device according to claim 3, being a DRAM.

5. The semiconductor memory device according to claim 1, wherein said multiplexer means sequentially connects said latch means to said input/output terminals in the order that is determined in accordance with said column address signal at least.

6. The semiconductor memory device according to claim 1, wherein, said multiplexer means sequentially connects said latch means to said input/output terminals in the order determined in accordance with said column address signal and said access order signal.

7. The semiconductor memory device according to claim 1, wherein, each of said latch means includes a read latch circuit for latching data on the bit line, and a write latch circuit for latching data supplied to said input/output terminals.

* * * * *

UNITED STATES PATENT AND TRADEMARK OFFICE
CERTIFICATE OF CORRECTION

PATENT NO. : 6,091,667
DATED : July 18, 2000
INVENTOR(S) : Tanaka et al.

It is certified that error appears in the above-identified patent and that said Letters Patent are hereby corrected as shown below:

Please correct the spelling of inventor Yotaro Mori. It is currently spelled Yolaro Mori but should be changed to YOTARO Mori.

Signed and Sealed this

Seventeenth Day of April, 2001

Attest:

NICHOLAS P. GODICI

Attesting Officer

Acting Director of the United States Patent and Trademark Office